(12) United States Patent
Hwang (10) Patent No.: US 8,044,478 B2
(45) Date of Patent: Oct. 25, 2011

(54) IMAGE SENSOR COMPRISING A PHOTODIODE IN A CRYSTALLINE SEMICONDUCTOR LAYER AND MANUFACTURING METHOD THEREOF

(75) Inventor: Joon Hwang, Cheongju-si (KR)

(73) Assignee: Dongbu Hitek Co., Ltd., Seoul (KR)

( * ) Notice: Subject to any disclaimer, the term of this patent is extended or adjusted under 35 U.S.C. 154(b) by 211 days.

(21) Appl. No.: 12/204,902

(22) Filed: Sep. 5, 2008

(65) Prior Publication Data

US 2009/0065827 A1    Mar. 12, 2009

(30) Foreign Application Priority Data

Sep. 7, 2007  (KR) .................. 10-2007-0090866
Jun. 24, 2008 (KR) .................. 10-2008-0059721

(51) Int. Cl.
*H01L 27/146* (2006.01)

(52) U.S. Cl. ........ 257/444; 257/222; 257/225; 257/290; 257/291; 257/292; 257/428; 257/431; 257/432; 257/443; 257/446; 257/448; 257/459; 257/461; 257/E27.122; 257/E27.127; 257/E27.13; 257/E27.131; 257/E27.132; 257/E27.133; 257/E27.15; 257/E27.151; 257/E27.152

(58) Field of Classification Search .......... 257/222, 257/225, 290, 291, 292, 428, 431, 432, 443, 257/444, 446, 448, 459, 461, E27.122, E27.127, 257/E27.13, E27.131, E27.132, E27.133, 257/E27.15, E27.151, E27.152
See application file for complete search history.

(56) References Cited

U.S. PATENT DOCUMENTS

| 5,557,121 | A  | * | 9/1996  | Kozuka et al. ............... 257/292 |
| 5,936,261 | A  |   | 8/1999  | Ma et al. |
| 6,501,065 | B1 | * | 12/2002 | Uppal et al. ................ 250/214.1 |
| 6,798,033 | B2 |   | 9/2004  | Chao et al. |
| 6,809,358 | B2 | * | 10/2004 | Hsieh et al. .................... 257/291 |
| 6,831,264 | B2 |   | 12/2004 | Cazaux |
| 6,927,432 | B2 | * | 8/2005  | Holm et al. .................... 257/290 |
| 7,189,952 | B2 | * | 3/2007  | Guedj et al. ................ 250/208.1 |
| 7,214,999 | B2 | * | 5/2007  | Holm et al. .................... 257/444 |
| 7,276,749 | B2 | * | 10/2007 | Martin et al. ................. 257/292 |
| 7,492,026 | B2 | * | 2/2009  | Thomas et al. ............... 257/444 |
| 7,812,299 | B2 | * | 10/2010 | Kusaka ....................... 250/208.1 |
| 2007/0018266 | A1 |   | 1/2007 | Dupont et al. |

FOREIGN PATENT DOCUMENTS

KR    10-2004-0058691 A    7/2004

OTHER PUBLICATIONS

Office Action dated Jun. 7, 2011 in German Application No. 10-2008-046101, filed Sep. 5, 2008.

* cited by examiner

*Primary Examiner* — Jay C Kim
(74) *Attorney, Agent, or Firm* — Saliwanchik, Lloyd & Eisenschenk (57) ABSTRACT

Provided is an image sensor. The image sensor can include a readout circuitry on a first substrate. An interlayer dielectric is formed on the first substrate, and comprises a lower line therein. A crystalline semiconductor layer is bonded to the interlayer dielectric. A photodiode can be formed in the crystalline semiconductor layer, and comprises a first impurity region and a second impurity region. A via hole can be formed passing through the crystalline semiconductor layer and the interlayer dielectric to expose the lower line. A plug is formed inside the first via hole to connect with only the lower line and the first impurity region. A device isolation region can be formed in the crystalline semiconductor layer to separate the photodiode according to unit pixel.

20 Claims, 8 Drawing Sheets

IMAGE SENSOR COMPRISING A PHOTODIODE IN A CRYSTALLINE SEMICONDUCTOR LAYER AND MANUFACTURING METHOD THEREOF

CROSS-REFERENCE TO RELATED APPLICATIONS

The present application claims the benefit under 35 U.S.C. §119 of Korean Patent Application No. 10-2007-0090866, filed Sep. 7, 2007, and Korean Patent Application No. 10-2008-0059721, filed Jun. 24, 2008, which are hereby incorporated by reference in their entirety.

BACKGROUND

An image sensor is a semiconductor device for converting an optical image into an electrical signal. The image sensor is roughly classified as a charge coupled device (CCD) image sensor or a complementary metal oxide semiconductor (CMOS) image sensor (CIS).

In an image sensor, a photodiode is formed in a substrate having readout circuitry using ion implantation. As the size of a photodiode reduces more and more for the purpose of increasing the number of pixels without an increase in a chip size, the area of a light receiving portion reduces, so that an image quality reduces.

Also, since a stack height does not reduce as much as the reduction in the area of the light receiving portion, the number of photons incident to the light receiving portion also reduces due to diffraction of light, called airy disk.

As an alternative to overcome this limitation, an attempt of forming a photodiode using amorphous silicon (Si), or forming a readout circuitry in a Si substrate and forming a photodiode on the readout circuitry using a method such as wafer-to-wafer bonding has been made (referred to as a "three-dimensional (3D) image sensor). The photodiode is connected with the readout circuitry through a metal line.

Meanwhile, a bonding surface of a wafer including a circuitry has two kinds of layers including material for a line and an interlayer dielectric at a wafer-to-wafer bonding interface. Because the materials of the interface are not uniform (same material at surface) according to a related art, the bonding force of the bonding surface may reduce, and accordingly, a dark current may be generated.

Also, according to a related art, a dark defect may be generated in a photodiode by the etching of a trench in a shallow trench isolation (STI) process for device isolation between pixels, resulting in incomplete device isolation between pixels.

According to a related art, since both the source and the drain at the sides of the transfer transistor are heavily doped with N-type impurities, a charge sharing phenomenon occurs. When the charge sharing phenomenon occurs, the sensitivity of an output image is reduced and an image error may be generated. Also, according to a related art, because a photo charge does not swiftly move between the photodiode and the readout circuitry, a dark current may be generated or saturation and sensitivity reduce.

BRIEF SUMMARY

Embodiments of the present invention provide an image sensor that can improve bonding force of a bonding surface during a wafer-to-wafer bonding operation while adopting vertical integration of a substrate, in which a readout circuitry is formed, and a photodiode, and a manufacturing method thereof.

In one embodiment, an image sensor can comprise: a first substrate comprising a readout circuitry; an interlayer dielectric on the first substrate, the interlayer dielectric comprising a lower line therein; a crystalline semiconductor layer on the interlayer dielectric; a photodiode in the crystalline semiconductor layer, the photodiode comprising a first impurity region and a second impurity region; a first via hole passing through the crystalline semiconductor layer and the interlayer dielectric to expose the lower line; a plug inside the first via hole to connect with only the lower line and the first impurity region; and a device isolation region in the crystalline semiconductor layer, the device isolation region separating the photodiode for each unit pixel.

In another embodiment, a method for manufacturing an image sensor comprises: forming a readout circuitry in a first substrate; forming an interlayer dielectric comprising a lower line on the first substrate; forming a second substrate comprising a crystalline semiconductor layer; forming a photodiode comprising a first impurity region and a second impurity region in the crystalline semiconductor layer; bonding the interlayer dielectric of the first substrate to the crystalline semiconductor layer of the second substrate; separating the second substrate such that the photodiode is exposed on the first substrate; forming a first via hole passing through the photodiode and the interlayer dielectric to expose the lower line; forming a plug inside the first via hole so that the plug is connected with the lower line and the first impurity region; and forming a device isolation region inside the crystalline semiconductor layer such that the photodiode is separated according to unit pixel.

The details of one or more embodiments are set forth in the accompanying drawings and the description below. Other features will be apparent from the description and drawings, and from the claims.

DETAILED DESCRIPTION

Embodiments of an image sensor and a manufacturing method thereof according to an embodiment will be described in detail with reference to the accompanying drawings.

Figure 13:
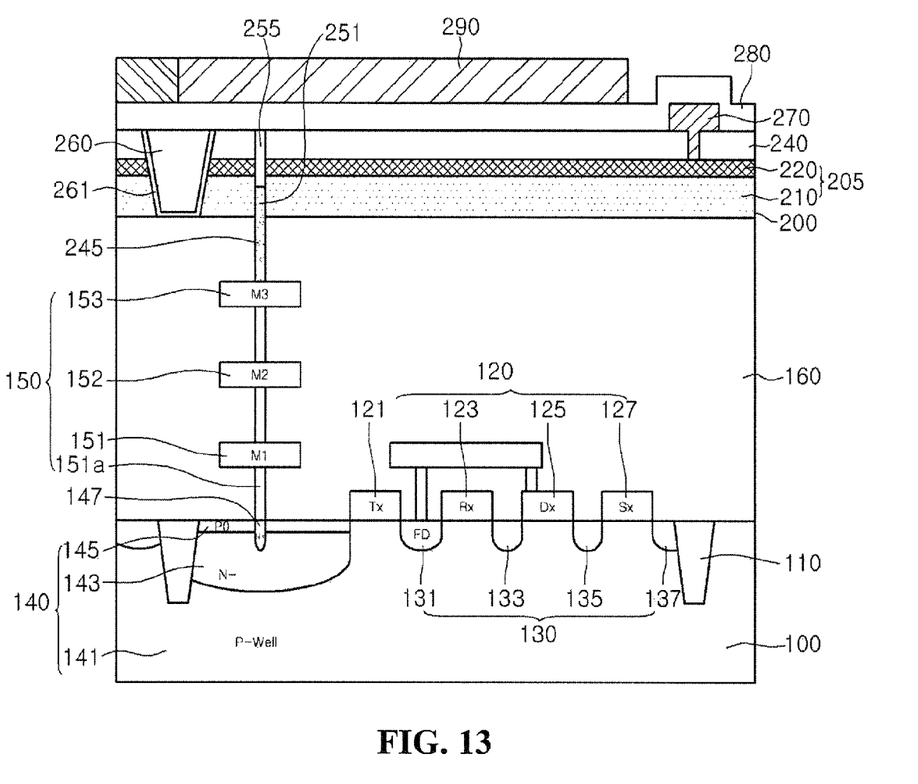

FIG. 13 is a cross-sectional view of an image sensor according to an embodiment.

Referring to FIG. 13, an image sensor can include: a first substrate 100 including a readout circuitry 120; an interlayer dielectric 160 on the first substrate, the interlayer dielectric including a lower line 150 therein; a crystalline semiconductor layer 200 on the interlayer dielectric 160; a photodiode 205 in the crystalline semiconductor layer 200, the photodiode being formed of a stacked first impurity region 210 and second impurity region 220; a via hole 245 passing through the crystalline semiconductor layer 200 and the interlayer dielectric 160 to expose the lower line 150; a plug 251 formed inside the first via hole 245 to connect with only the lower line 150 and the first impurity region 210; and a device isolation region 260 in the crystalline semiconductor layer 200, the device isolation region separating the photodiode 205 for each unit pixel.

A third metal 153 on the uppermost portion of the lower line 150 can be formed inside the interlayer dielectric 160, so that it is not exposed. By providing the third metal 153 with its top surface not exposed, the bonding surface of the first substrate 100 has one kind of layer for improved bonding force. The photodiode 205 formed in the crystalline semiconductor layer 200 can include an n-type impurity region 210 and a p-type impurity region 220. A first passivation layer 240, which is an oxide layer or a nitride layer, can be disposed on the crystalline semiconductor layer 200 after the crystalline semiconductor layer 200 has been bonded to the first substrate 100.

The plug 251 can be selectively formed in the first via hole 245 so that the first impurity region 210 of the photodiode 205 is connected with the lower line 150. That is, since the plug 251 is not connected with the second impurity region 220, an electrical short-circuit of the photodiode 205 can be prevented.

A dielectric 255 can be formed on the plug 251 to fill the first via hole 245.

An upper electrode 270 can be disposed in a second via hole 249 of the first passivation layer 240. The upper electrode 270 contacts the second impurity region 220 through the second via hole 249 to electrically connect with the photodiode 205.

In the image sensor according to the embodiment, a 3D image sensor where a photodiode is located on a readout circuitry is adopted to increase a fill factor. Also, a photodiode can be formed in the crystalline semiconductor layer to reduce defects of the photodiode. Also, a device isolation region can be formed in the crystalline semiconductor layer to inhibit crosstalk and noise generation.

Next, according to an embodiment, a device is designed such that a potential difference is generated between a source and drain at sides of a transfer transistor Tx, so that a photo charge can be fully dumped. Accordingly, since a photo charge generated from the photodiode is fully dumped to a floating diffusion region, the sensitivity of an output image can be increased.

That is, an electrical junction region 140 can be formed in the first substrate 100 where the readout circuitry 120 is formed to allow a potential difference to be generated between the source and the drain at sides of the transfer transistor Tx 121, so that a photo charge can be fully dumped. The readout circuitry 120 can include, for example, a transfer transistor Tx 121, a reset transistor Rx 123, a drive transistor Dx 125, and a select transistor Sx 127.

Hereinafter, a dumping structure of a photo charge according to an embodiment is described in detail.

The electrical junction region 140 can include a first conduction type ion implantation layer 143 formed on a second conduction type well 141 (or a second conduction type epitaxial layer (not shown)), and a second conduction type ion implantation layer 145 formed on the first conduction type ion implantation layer 143. For example, the electrical junction region 140 can be, but is not limited to, a PN junction or a PNP junction.

Unlike a node of a floating diffusion FD 131, which is an N+ junction, a PNP junction 140, which is the electrical junction region 140 and to which an applied voltage is not fully transferred, is pinched-off at a predetermined voltage. This voltage is called a pinning voltage, which depends on the doping concentrations of the P0 region 145 and the N− region 143.

Specifically, an electron generated from the photodiode 205 moves to the PNP junction 140, and is transferred to the node of the floating diffusion FD 131 and converted into a voltage when the transfer transistor Tx 121 is turned on.

Since a maximum voltage value of the P0/N−/P− junction 140 becomes a pinning voltage, and a maximum voltage value of the node of the floating diffusion FD 131 becomes Vdd minus a threshold voltage Vth of Rx 123, an electron generated from the photodiode 205 in the upper portion of a chip can be fully dumped to the node of the floating diffusion FD 131 without charge sharing by implementing a potential difference between the sides of the transfer transistor Tx 121.

That is, according to an embodiment, the P0/N−/P-well junction, not an N+/P-well junction, is formed in the first substrate, to allow a + voltage to be applied to the N-region 143 of the P0/N−/P-well junction and a ground voltage to be applied to the P0 145 and P-well 141 during a 4-Tr active pixel sensor (APS) reset operation, so that a pinch-off is generated to the P0/N−/P-well double junction at a predetermined voltage or more as in a bipolar junction transistor (BJT) structure. This is called a pinning voltage. Therefore, a potential difference is generated between the source and the drain of the transfer transistor Tx 121 to inhibit a charge sharing phenomenon during the on/off operations of the transfer transistor Tx.

Therefore, unlike a case where a photodiode is simply connected with an N+ junction as in a related art, limitations such as saturation reduction and sensitivity reduction can be avoided for image sensors according to embodiments of the present invention.

In a further embodiment, a first conduction type connection region 147 can be formed between the photodiode and the readout circuitry to provide a swift movement path of a photo charge, so that a dark current source is minimized, and saturation reduction and sensitivity reduction can be inhibited.

For this purpose, in one embodiment, the first conduction type connection region 147 for ohmic contact can be formed on the surface of the P0/N−/P− junction 140. Meanwhile, to inhibit the first conduction type connection region 147 from becoming a leakage source, the width of the first conduction type connection region 147 can be minimized. By doing so, a dark current of the 3D image sensor can be reduced.

That is, a reason of locally and heavily doping only a contact forming portion with N type impurities is to facilitate ohmic contact formation while minimizing a dark signal. In case of heavily doping the entire transfer transistor (Tx source), a dark signal may be increased by a Si surface dangling bond.

Reference numerals not explained in FIG. 13 are explained in a manufacturing method thereof below.

A method for manufacturing an image sensor according to an embodiment is described with reference to FIGS. 1 to 13.

Figure 1:
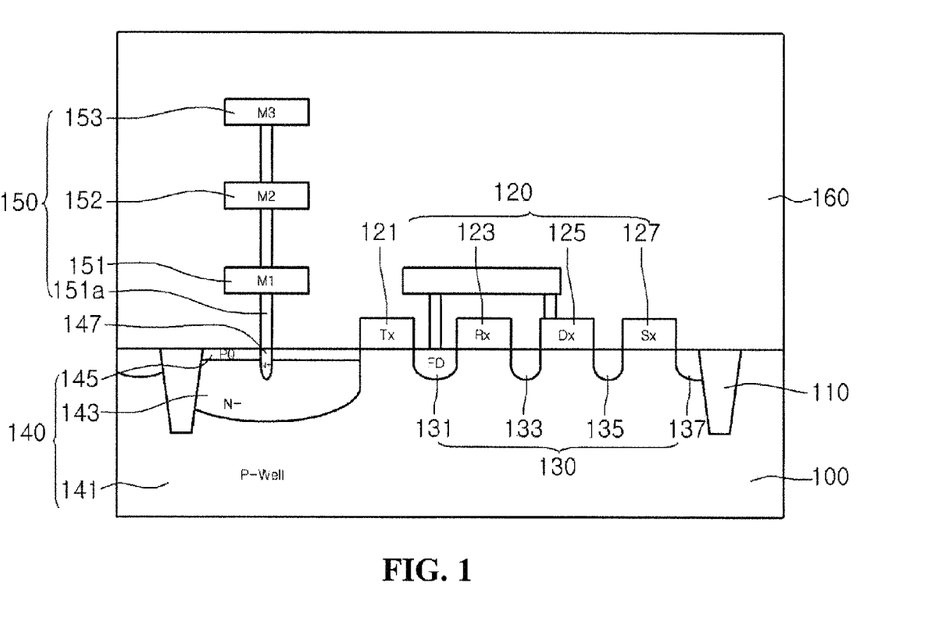
FIGS. 1 to 13 are cross-sectional views illustrating a manufacturing process of an image sensor according to an embodiment.

Referring to FIG. 1, a readout circuitry 120 can be formed on the first substrate 100.

A device isolation layer 110 defining an active region and a field region can be formed in the first substrate 100. The readout circuitry 120 including a transistor can be formed on the active region of the first substrate 100. For example, the readout circuitry 120 can include the transfer transistor Tx 121, the reset transistor Rx 123, the drive transistor Dx 125, and the select transistor Sx 127. After forming gates for the transistors, the floating diffusion region FD 131 and ion implantation regions 130 including source/drain regions of the respective transistors can be formed.

The forming of the readout circuitry 120 in the first substrate 100 can include forming the electrical junction region 140 in the first substrate 100 and forming the first conduction type connection region 147 for connection with the lower line 150 on the electrical junction region 140.

For example, the electrical junction region 140 can be, but is not limited to, a PN junction 140. For example, the electrical junction region 140 can include the first conduction type ion implantation layer 143 formed on the second conduction type well 141 (or a second conduction type epitaxial layer), and a second conduction type ion implantation layer 145 formed on the first conduction type ion implantation layer 143. In one embodiment, the PN junction 140 can be the P0 (145)/N− (143)/P− (141) junction shown in FIG. 1. The first substrate 100 can be, but is not limited to, a second conduction type substrate.

According to an embodiment, the electrical junction region 140 is formed in the first substrate 100 where the readout circuitry 120 is formed to allow a potential difference to be generated between the source and the drain of the transfer transistor Tx 121, so that a photo charge can be fully dumped.

That is, according to an embodiment, a device is designed such that there is a potential difference between the source and drain of the transfer transistor Tx, so that a photo charge can be fully dumped. For example, a device can be designed such that a potential difference is generated between the source and drain of the transfer transistor Tx by making the doping concentration of the N-region 143 lower than the doping concentration of the floating diffusion region FD 131.

Next, the first conduction type connection region 147 for ohmic contact can be formed on the P0/N−/P− junction 140. For example, an N+ region 147 for ohmic contact can be formed on the surface of the P0/N−/P− junction 140. The N+ region 147 can be formed to pass through the P0 region 145 and contact the N-region 143.

Meanwhile, to inhibit the first conduction type connection region 147 from becoming a leakage source, the width of the first conduction type connection region 147 can be minimized. For this purpose, a plug implant can be performed after etching a via hole for a first metal contact 151a. In an alternate embodiment, ion implantation patterns (not shown) can be formed and then the first conduction type connection region 147 can be formed using the ion implantation patterns as an ion implantation mask.

According to embodiments, the first conduction type connection region 147 is formed between the photodiode and the readout circuitry 120 to provide a swift movement path of a photo charge and thus minimize a dark current source and inhibit saturation reduction and sensitivity reduction.

The lower line 150 and the interlayer dielectric 160 can be formed on the first substrate 100. The lower line 150 can include, but is not limited to, the first metal contact 151a, a first metal 151, a second metal 152, and a third metal 153.

The lower line 150 can be formed of various conductive materials including metal, alloy, and silicide. For example, the lower line 150 can be formed of aluminum, copper, cobalt, or tungsten. The interlayer dielectric 160 can be formed to entirely cover the third metal 153 of the lower line 150. Therefore, since the interlayer dielectric 160 is formed on the first substrate 100, when a planarization process is performed on the interlayer dielectric 160, the interlayer dielectric 160 can become a uniform surface.

Figure 2:
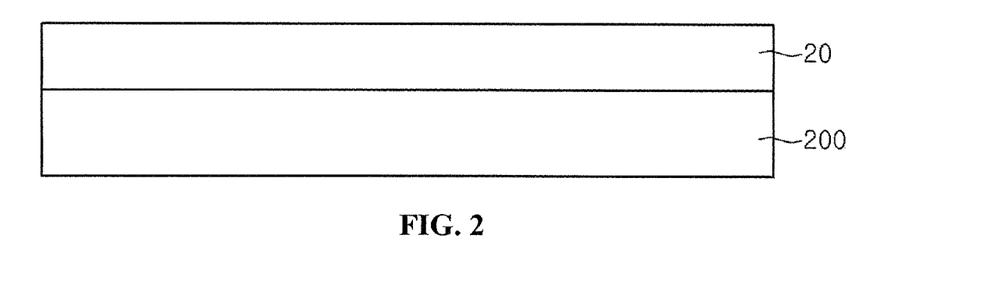

Referring to FIG. 2, a second substrate 20 including a crystalline semiconductor layer 200 can be prepared. The second substrate 20 can be a single crystal or polycrystal silicon substrate, and can be a substrate doped with p-type impurities or n-type impurities. In an embodiment, the crystalline semiconductor layer 200 can be formed on the second substrate 20 through epitaxial growing.

Figure 3:
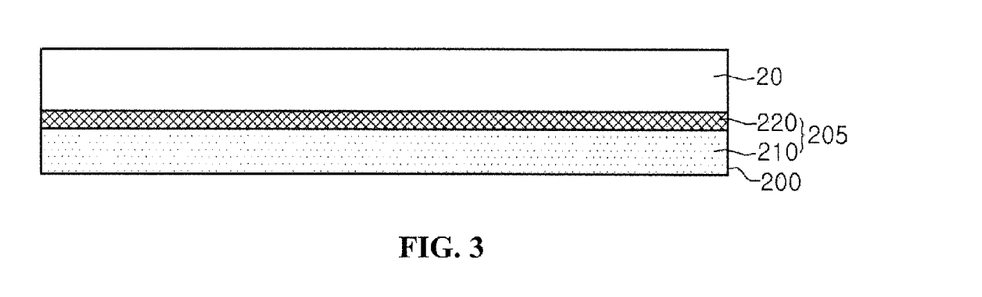

Referring to FIG. 3, the photodiode 205 is formed in the crystalline semiconductor layer 200. The photodiode 205 can include a first impurity region 210 and a second impurity region 220. The first impurity region 210 can be formed by implanting n-type impurities into a deep region of the crystalline semiconductor layer 200 (i.e., closest to the second substrate). The second impurity region 220 can be formed by implanting p-type impurities into a shallow region of the crystalline semiconductor layer 200 (i.e., near the surface of the crystalline semiconductor layer 200). Since the photodiode 205 has a PN junction, a photo charge generated from the photodiode 205 can be transferred to the readout circuitry 120 through the lower line 150.

Figure 4:
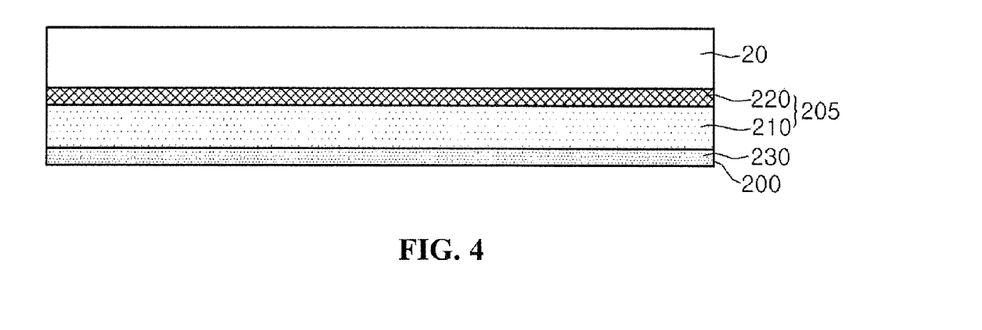

Referring to FIG. 4, an ohmic contact layer 230 can be formed by implanting high concentration n-type impurities (n+) into the surface of the first impurity region 210. When the ohmic contact layer 230 is formed on the first impurity region 210, contact resistance of the line connected with the photodiode can be reduced. Hereinafter, description is made using an example where the ohmic contact layer 230 is omitted.

Since the photodiode 205 is formed in the crystalline semiconductor layer 200 through ion implantation, a defect inside the photodiode 205 can be inhibited and generation of a dark current can be blocked.

Figure 5:
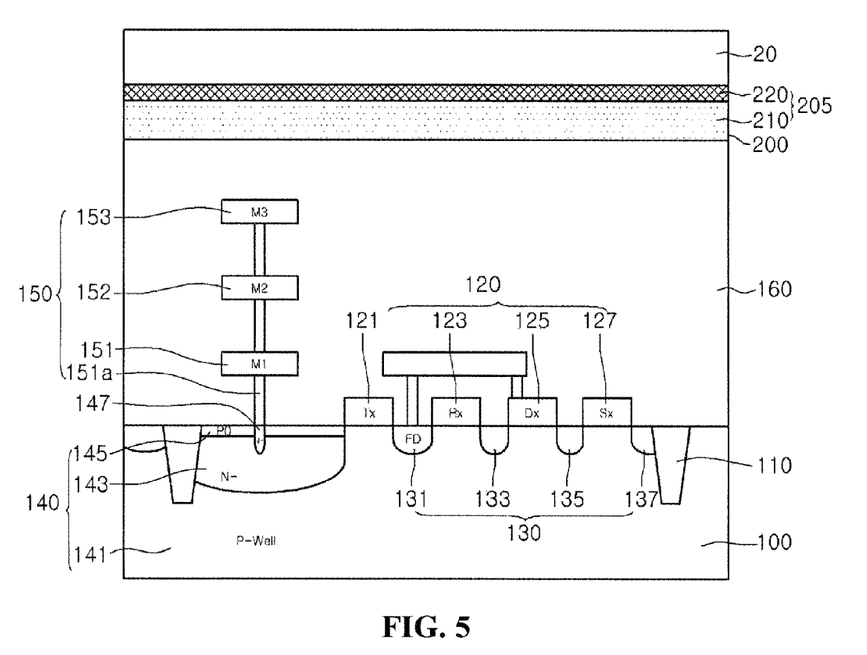

Referring to FIG. 5, the first substrate 100 including the interlayer dielectric 160, and the second substrate 20 including the crystalline semiconductor layer 200 are bonded to each other. When the first substrate 100 and the second substrate 20 are bonded to each other, the surface of the interlayer dielectric 160 and the first impurity region 210 (or the ohmic contact layer 230, if used) of the photodiode 205 become bonded.

Particularly, since the interlayer dielectric 160 of the first substrate 100 has a planarized surface not exposing a metal line and the surface of the crystalline semiconductor layer 200 of the second substrate 20 has a planarized surface, bonding force between the first substrate 100 and the second substrate 200 can improve.

Figure 6:
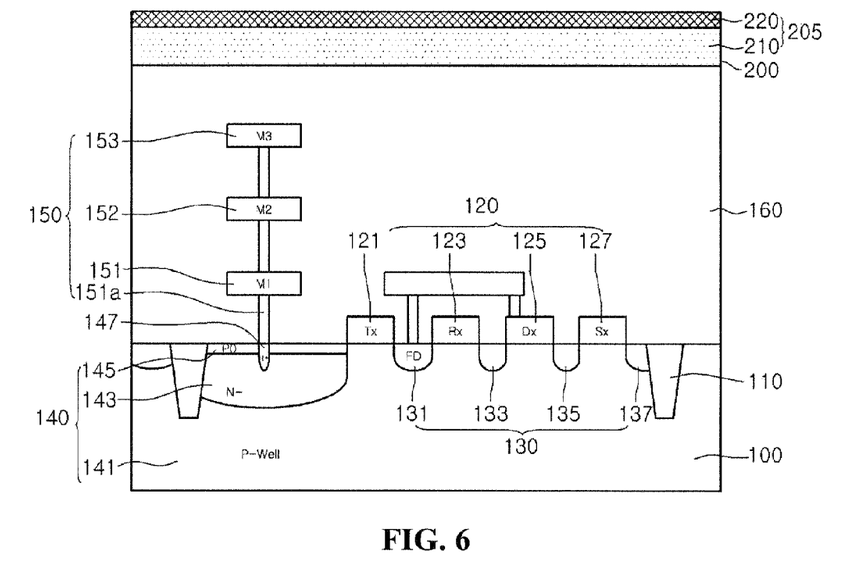

Referring to FIG. 6, the second substrate 20 can be removed such that the photodiode 205 remains on the first substrate 100. In one embodiment, a portion of the second substrate 20 can be removed using a blade, so that the photodiode 205 can be exposed.

Figure 7:
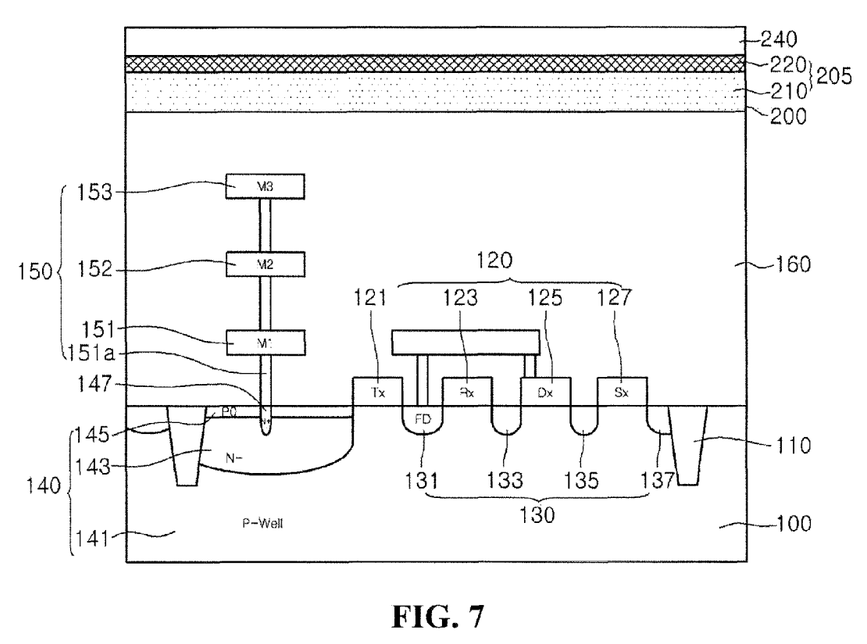

Referring to FIG. 7, a first passivation layer 240 is formed on the crystalline semiconductor layer 200. For example, the first passivation layer 240 can be an oxide layer or a nitride layer, and particularly, can be a low temperature oxide layer.

Figure 8:
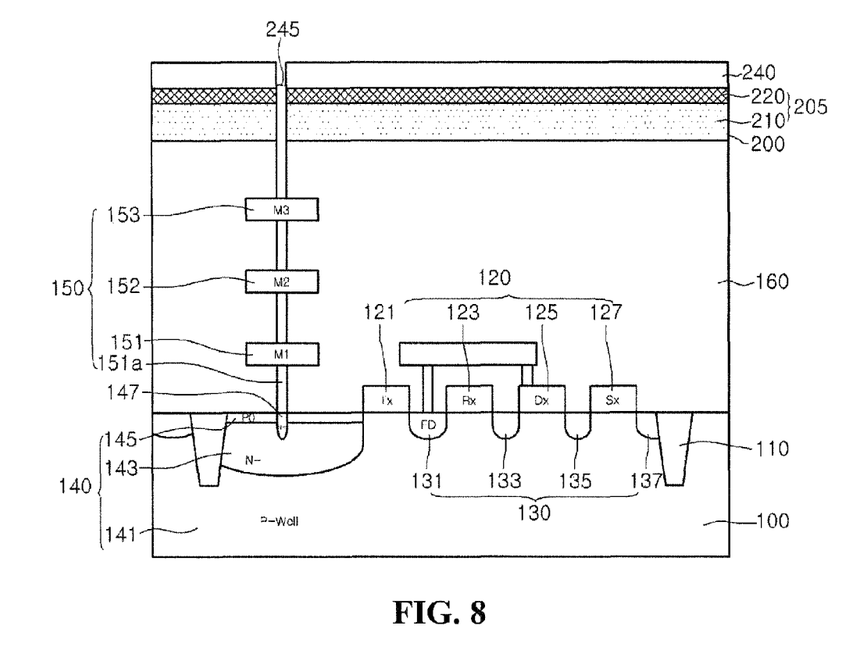

Referring to FIG. 8, a first via hole 245 exposing the third metal 153 of the first substrate 100 can be formed. The first via hole 245 can be formed by removing portions of the first passivation layer 240, the crystalline semiconductor layer 200, and the interlayer dielectric 160. Then, the third metal 153 inside the interlayer dielectric 160 is exposed. For example, the first via hole 245 can be formed by forming a photoresist pattern on the first passivation layer 240 and performing a wet etching or dry etching process.

Figure 9:
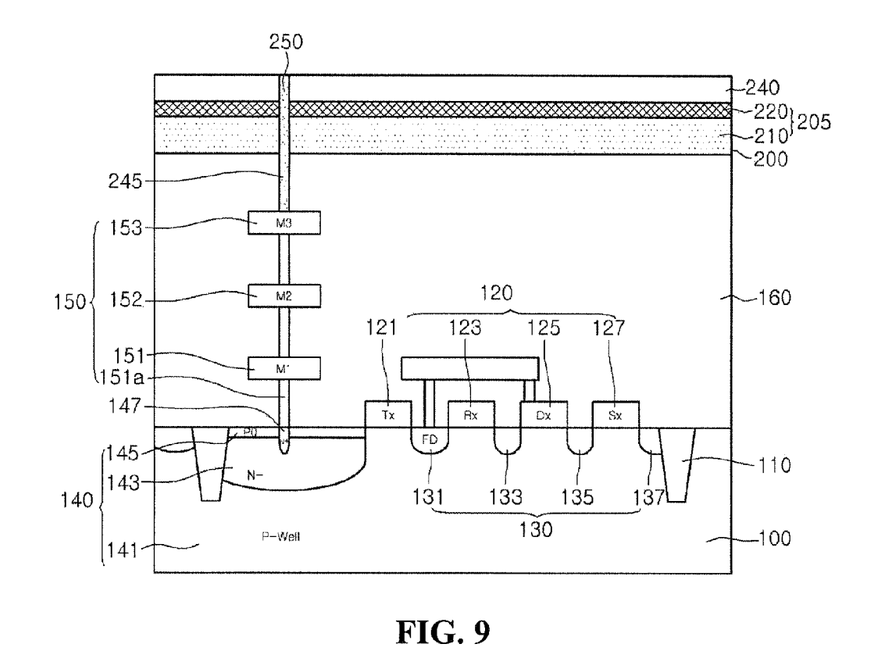

Referring to FIG. 9, a metal layer 250 can be formed inside the first via hole 245. The metal layer 250 is formed inside the first via hole 245 to electrically connect the lower line 150 to the photodiode 205. For example, the metal layer 250 can be formed by depositing conductive materials including aluminum, copper, titanium, and tungsten, and planarizing the same.

Figure 10:
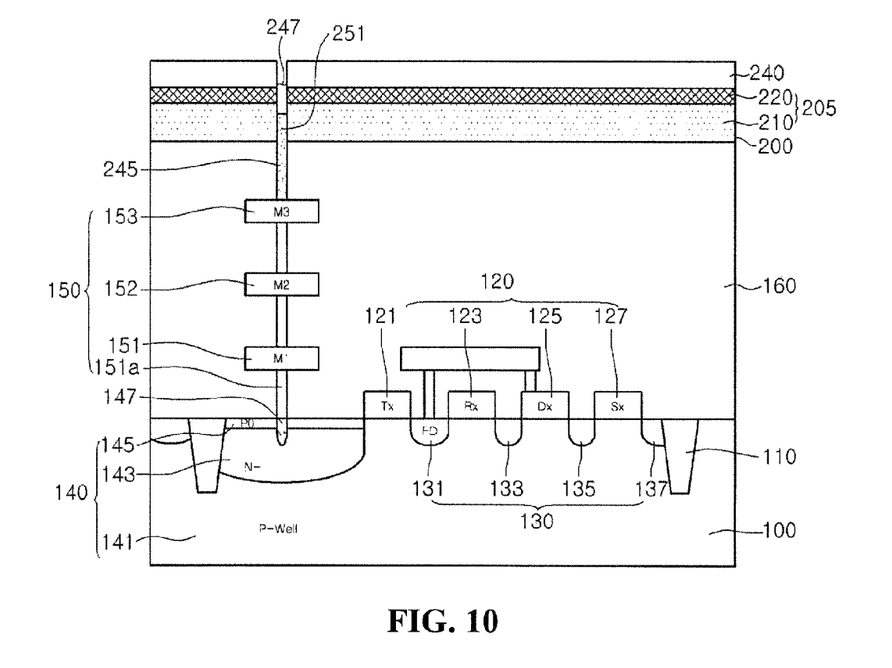

Referring to FIG. 10, a plug 251 can be formed from the metal layer 250 by performing an etching process on the metal layer 250. The plug 251 is formed to contact in the photodiode 205 portion only the first impurity region 210 to transfer a photo charge generated from the photodiode 205 to the lower line 150.

The plug 251 can be formed by removing the upper region of the metal layer 250 using wet or dry etching. Then, a first via hole pattern 247 is formed on the plug 205 to expose the second impurity region 220 and a sidewall 240 of the first passivation layer 240.

Therefore, since the plug 251 does not contact the second impurity region 220 of the photodiode 205, a short-circuit of the photodiode 205 can be prevented.

Figure 11:
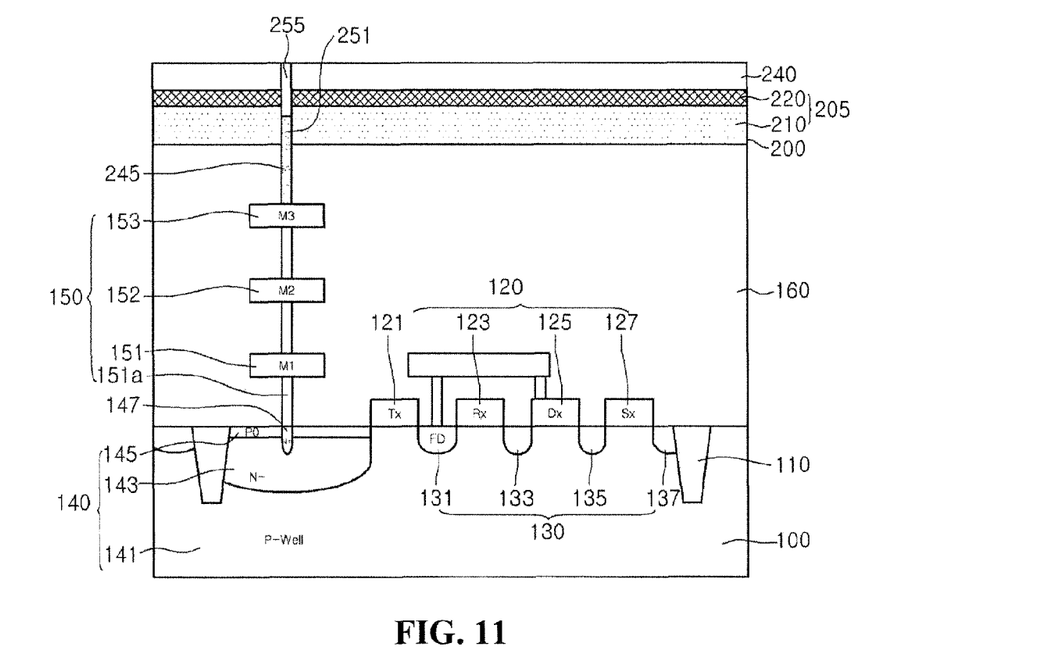

Referring to FIG. 11, a dielectric 255 gap-fills the first via hole pattern 247. The dielectric 255 can be formed of the same material as the first passivation layer 240.

Figure 12:
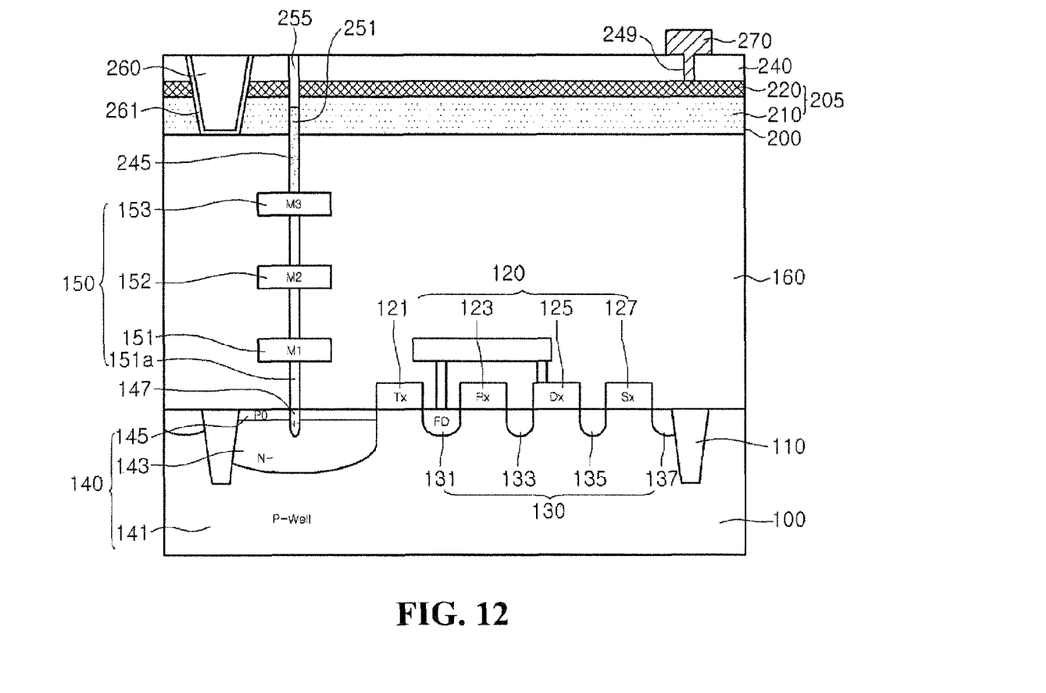

Referring to FIG. 12, in an embodiment, a device isolation region 260 can be formed in the first passivation layer 240 and the crystalline semiconductor layer 200. The device isolation region 260 can be formed by shallow trench isolation (STI), or can be formed by ion implantation. In the case where the device isolation region 260 is an STI, a liner oxide layer 261 can be formed on the device isolation region 260.

Accordingly, the device isolation region 260 is formed in the crystalline semiconductor layer 200 to separate the photodiode 205 for each unit pixel.

Next, an upper electrode 270 can be formed on the first passivation layer 240 to electrically connect with the photodiode 205. The upper electrode 270 contacts a portion of the second impurity region 220 of the photodiode 205 through the second via hole 249 formed in the first passivation layer 240. Also, in an embodiment, the upper electrode 270 can be formed by forming an upper electrode layer (not shown) on the first passivation layer 240 including in the second via hole 249, and then removing a portion of the upper electrode layer on a unit pixel region. Though not shown, the second via hole 249 can be formed for each photodiode 205 separated for each unit pixel by the device isolation region 260.

Since the upper electrode 270 can be selectively formed on a portion of the photodiode 205, the upper electrode 270 does not have an influence on a light receiving region of the photodiode.

Referring to FIG. 13, a second passivation layer 280 can be formed by depositing a nitride layer or an oxide layer on the first passivation layer 240 on which the upper electrode 270 is formed. Also, a color filter 290 can be formed on a portion of the second passivation layer 280 corresponding to the photodiode for a unit pixel.

According to the method for manufacturing the image sensor, the first substrate including the lower line and the crystalline semiconductor layer including the photodiode are bonded using a bonding process, so that vertical integration can be achieved.

Also, according to an embodiment, since the photodiode is formed on top of the first substrate, the focal length of the photodiode is reduced to improve a light receiving rate.

By providing vertical integration, additional on-chip circuitry can be integrated with the first substrate to increase the performance of the image sensor. In addition, further miniaturization of a device can be obtained and manufacturing costs can be reduced.

Also, according to embodiments, a photodiode can be formed by implanting ions into a separate substrate, so that a defect inside the photodiode can be reduced.

According to an embodiment, because a device isolation region can be formed such that the photodiode is separated for each unit pixel, crosstalk and noise generation can be reduced.

Also, according to embodiments, since a solid bonding surface is achieved by the uniform surfaces of the first substrate and the second substrate when a bonding process is performed, the reliability of the image sensor can improve.

Figure 14:
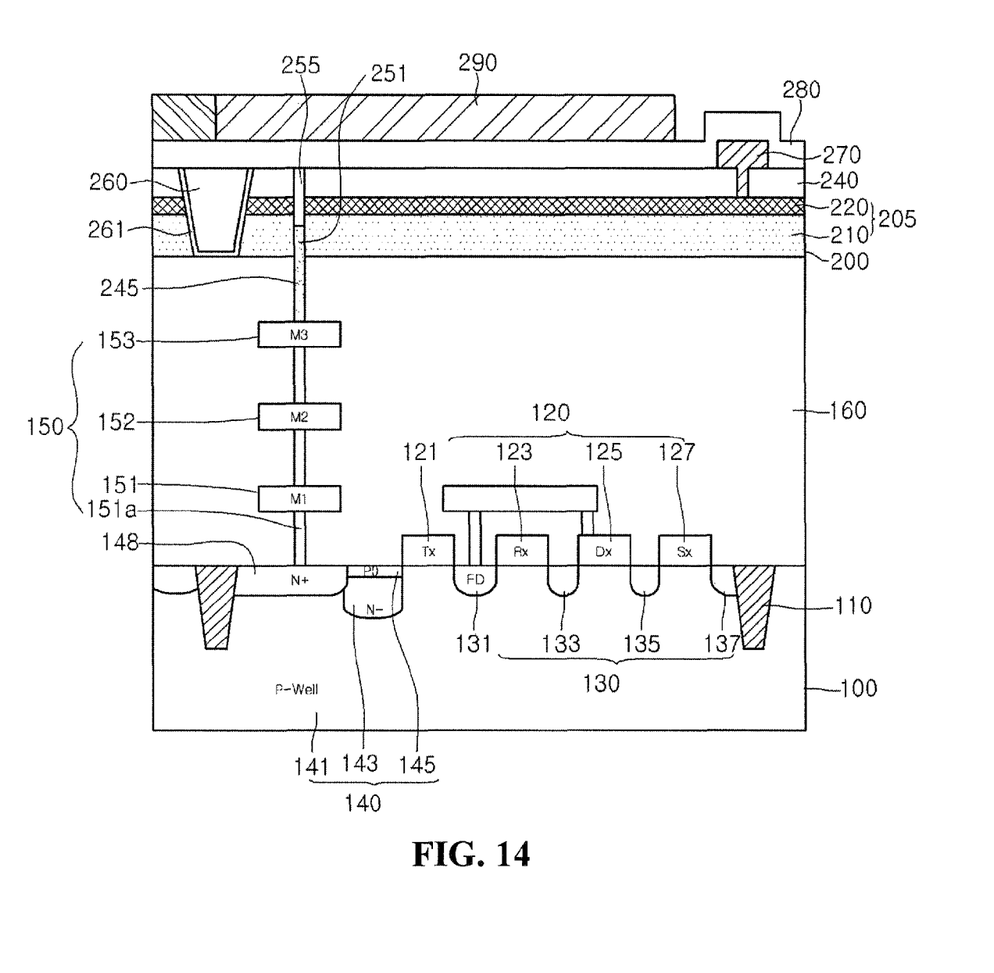
FIG. 14 is a partial detailed view of an image sensor according to another embodiment.

FIG. 14 is a cross-sectional view of an image sensor according to another embodiment.

Referring to FIG. 14, an image sensor can include: a first substrate 100 including a line 150 and readout circuitry 120; and a crystalline semiconductor layer 200 including a photodiode 205 and a device isolation region 260 on the readout circuitry 120. The readout circuitry 120 of the first substrate 100 can include: an electrical junction region 140 formed in the first substrate 100; and a first conduction type connection region 148 connected with the line 150 at a side of the electrical junction region.

This embodiment can adopt technical characteristics of the embodiments described with respect to FIGS. 1 to 13.

According to an embodiment, a device is designed such that a potential difference is generated between a source and drain of a transfer transistor Tx, so that a photo charge can be fully dumped. Accordingly, since a photo charge generated from the photodiode is fully dumped to a floating diffusion region, the sensitivity of an output image can be increased.

Also, according to embodiments, a charge connection region is formed between the photodiode and the readout circuitry to provide a swift movement path of a photo charge, so that a dark current source is minimized, and saturation reduction and sensitivity reduction can be inhibited.

Meanwhile, unlike an embodiment described above, the embodiment as shown in FIG. 14 illustrates a first conduction type connection region 148 formed at a side of the electrical junction region 140.

According to an embodiment, an N+ connection region 148 for ohmic contact can be formed at the P0/N−/P− junction 140. At this point, a process of forming the N+ connection region 148 and an MIC contact 151a may provide a leakage source because the device operates with a reverse bias applied to the P0/N−/P− junction 140 and so an electric field EF can be generated on the Si surface. A crystal defect generated during the contact forming process inside the electric field serves as a leakage source.

Also, according to an embodiment, in the case where the N+ connection region 148 is formed on the surface of the P0/N−/P− junction 140, an electric field due to the N+/P0 junction 148/145 is added. This electric field also serves as a leakage source.

Therefore, a further embodiment of the present invention proposes a layout in which a first contact plug 151a is formed in an active region not doped with a P0 layer but including an N+ connection region 148. Then, the first contact plug 151a is connected with the N-junction 143 through the N+ connection region 148.

According to such an embodiment, the electric field is not generated on the Si surface, which can contribute to reduction in a dark current of a 3D integrated CIS.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. An image sensor comprising:
a first substrate comprising a readout circuitry;
an interlayer dielectric on the first substrate, the interlayer dielectric comprising a lower conductive line therein;
a crystalline semiconductor layer on the interlayer dielectric;
a photodiode in the crystalline semiconductor layer, the photodiode comprising a first impurity region and a second impurity region;
a first via hole passing through the crystalline semiconductor layer and the interlayer dielectric to expose the lower conductive line;
a plug inside the first via hole connecting the lower conductive line to the first impurity region, wherein a top surface of the plug is below the second impurity region; and
a device isolation region in the crystalline semiconductor layer, the device isolation region separating the photodiode according to a unit pixel.

2. The image sensor according to claim 1, further comprising a first passivation layer on the crystalline semiconductor layer.

3. The image sensor according to claim 1, further comprising a dielectric on the plug, the dielectric filling the first via hole.

4. The image sensor according to claim 1, wherein the readout circuitry comprises an electrical junction region in the first substrate, wherein the electrical junction region comprises:
a first conduction type ion implantation region in the first substrate; and
a second conduction type ion implantation region on the first conduction type ion implantation region.

5. The image sensor according to claim 4, further comprising a first conduction type connection region electrically connected with the lower conductive line on the electrical junction region.

6. The image sensor according to claim 5, wherein the electrical junction region comprises a PNP junction.

7. The image sensor according to claim 1, wherein the readout circuitry is designed such that a potential difference is generated between a source and a drain of a transistor.

8. The image sensor according to claim 7, wherein the transistor comprises a transfer transistor, and an ion implantation impurity concentration of the source of the transistor is lower than an ion implantation impurity concentration of a floating diffusion region at the drain of the transistor.

9. The image sensor according to claim 4, further comprising a first conduction type connection region electrically connected with the lower conductive line at a side of the electrical junction region.

10. A method for manufacturing an image sensor, according to claim 1, the method comprising:
forming a readout circuitry on a first substrate;
forming an interlayer dielectric comprising a lower conductive line on the first substrate;
forming a second substrate comprising a crystalline semiconductor layer;
forming a photodiode comprising a first impurity region and a second impurity region in the crystalline semiconductor layer;
bonding the interlayer dielectric of the first substrate to the crystalline semiconductor layer of the second substrate such that the crystalline semiconductor layer is on the interlayer dielectric;
separating the second substrate such that the photodiode is exposed on the first substrate;
forming a first via hole passing through the photodiode and the interlayer dielectric to expose the lower conductive line;
forming a plug inside the first via hole so that the plug is connected with the lower conductive line and the first impurity region and a top surface of the plug is below the second impurity region; and
forming a device isolation region in the crystalline semiconductor layer such that the photodiode is separated according to a unit pixel.

11. The method according to claim 10, further comprising forming a first passivation layer on the crystalline semiconductor layer after separating the second substrate.

12. The method according to claim 10, wherein the forming of the plug comprises:
removing a portion of the crystalline semiconductor layer and a portion of the interlayer dielectric to form the first via hole exposing the lower conductive line;
filling the first via hole with a metal layer; and
removing a portion of the metal layer to expose the second impurity region at sides in the first via hole.

13. The method according to claim 12, further comprising filling a remaining area of the first via hole with a dielectric after the forming of the plug.

14. The method according to claim 10, wherein the device isolation region is formed using a shallow trench isolation process.

15. The method according to claim 10, wherein the device isolation region is formed using an ion implantation method.

16. The method according to claim 10, wherein the forming of the readout circuitry on the first substrate comprises forming an electrical junction region in the first substrate, wherein forming of the electrical junction region in the first substrate comprises:
forming a first conduction type ion implantation region in the first substrate; and
forming a second conduction type ion implantation region on the first conduction type ion implantation region.

17. The method according to claim 16, further comprising forming a first conduction type connection region connected with the lower conductive line on the electrical junction region.

18. The method according to claim 17, wherein the forming of the first conduction type connection region is performed after performing a contact etch for the lower conductive line.

19. The method according to claim 16, further comprising forming a first conduction type connection region connected with the lower conductive line at a side of the electrical junction region.

20. The method according to claim 19, wherein the first conduction type connection region is formed between a device isolation region of the first substrate and the electrical junction region, and contacts the device isolation region of the first substrate and the electrical junction region.

* * * * *